United States Patent [19]
Kim

[11] Patent Number: 5,739,728
[45] Date of Patent: Apr. 14, 1998

[54] RC OSCILLATOR IN WHICH A PORTION OF CHARGING CURRENT IS SHUNTED AWAY FROM CAPACITOR

[75] Inventor: Su-Gyeong Kim, Seoul, Rep. of Korea

[73] Assignee: Samsung Electronics, Rep. of Korea

[21] Appl. No.: 671,410

[22] Filed: Jun. 27, 1996

[30] Foreign Application Priority Data

Jun. 29, 1995 [KR] Rep. of Korea ............... 1995 18269

[51] Int. Cl.$^6$ ............... H03B 5/20; H03L 1/02
[52] U.S. Cl. ............... 331/111; 331/143; 331/176
[58] Field of Search ............... 331/111, 143, 331/176

[56] References Cited

U.S. PATENT DOCUMENTS

| | | | |
|---|---|---|---|
| 4,359,649 | 11/1982 | Mundel | 331/111 |
| 4,471,326 | 9/1984 | Steckler et al. | 331/111 |
| 4,639,692 | 1/1987 | Kitaguchi | 331/111 |

*Primary Examiner*—Siegfried H. Grimm
*Attorney, Agent, or Firm*—Marger, Johnson, et al.

[57] ABSTRACT

An analog oscillator for an integrated circuit operates at low frequency with reduced sensitivity to noise and can be implemented with a capacitor that takes up a small amount of die space. The oscillator charges a capacitor by generating a current with a charge current source and then shunting a portion of the current away from the capacitor with a shunt current source. The current sources are implemented in bipolar transistors which are operated at high current to reduce sensitivity to noise. The capacitor is charged slowly by a small difference current which is equal to the difference between the current from the charge current source and the current from the shunt current source. A Schmitt trigger comparator compares the capacitor voltage to a reference voltage and controls a discharge current source which discharges the capacitor. The current sources include current mirrors and are temperature compensated.

18 Claims, 3 Drawing Sheets

RC OSCILLATOR IN WHICH A PORTION OF CHARGING CURRENT IS SHUNTED AWAY FROM CAPACITOR

BACKGROUND OF THE INVENTION

1. Field of the Invention

The present invention relates to analog oscillator circuits, and more particularly, to analog oscillator circuits which can operate at low frequencies with a small capacitor and reduced sensitivity to noise.

2. Description of the Related Art

FIG. 1 shows a conventional analog RC oscillator having a capacitor C1, first and second resistors R1 and R2, a comparator COMP and a switch S1. When the voltage across the capacitor C1 is less than a bias voltage Vbias1, the output of the comparator is at a logic low level and switch S1 is open. The capacitor is charged by current flowing through resistor R1 from a voltage source Vcc. When the voltage across the capacitor exceeds Vbias1, the output of the comparator switches to a high logic level which closes switch S1. The capacitor is then discharged through resistor R2. When the capacitor voltage drops back below Vbias1, the comparator opens switch S1, thereby beginning a new cycle.

One problem with the circuit of FIG. 1 is that it is sensitive to noise. Another problem is that, when implemented on an integrated circuit, the oscillator cannot be operated at low frequencies since the resistor R1 and/or the capacitor C1 must have large values. In a typical low frequency application, e.g., a frequency on the order of 50 kilohertz (KHz), capacitor C1 must have a capacitance greater than 500 picofarads (pF) which takes up excessive die area.

FIG. 2. shows another conventional analog RC oscillator circuit. This circuit is similar to the circuit of FIG. 1, but resistor R1 is replaced by a first current source I1 which charges the capacitor when switch S1 is open, and resistor R2 is replaced by a second current source I2 which discharges the capacitor when the switch is closed. The capacitor is discharged by a current which is the difference of the currents flowing through current sources I1 and I2. The current sources are typically implemented with bipolar transistors.

If current sources I1 and I2 are operated at relatively high currents, the circuit of FIG. 2 is generally less sensitive to noise than the circuit if FIG. 1. However, if high currents are used, the capacitor must still be made excessively large in order for the circuit to operate at low frequencies. If lower current levels are utilized in an attempt to reduce the size of the capacitor, the circuit becomes more sensitive to noise. The bipolar transistors used to implement the current sources also suffer from poor current gain and instability at low current levels.

Accordingly, a need remains for an oscillator circuit that can overcome the problems discussed above.

SUMMARY OF THE INVENTION

It is, therefore, an object of the invention to operate an analog oscillator at low frequencies with reduced noise sensitivity.

Another object of the invention to provide an analog oscillator which can be implemented on an integrated circuit without using excessive die area.

One aspect of the present invention is an oscillator circuit comprising: a capacitor; a first current source coupled to the capacitor, the first current source generating a first current to charge the capacitor; a second current source coupled to the capacitor, the second current source generating a second current to discharge the capacitor; a comparator coupled to the capacitor and the second current source to control the second current source responsive to the capacitor voltage; and a third current source coupled to the capacitor to shunt a portion of the first current away from the capacitor.

A switch can be coupled to the second current source to control the second current source, and a temperature compensation circuit can be coupled to the current sources. The second and third current sources can include current mirror circuits.

Another aspect of the present invention is an oscillator circuit comprising: a capacitor; means for generating a current to charge the capacitor, thereby generating a capacitor voltage signal; means for comparing the capacitor voltage signal to a bias signal; means for discharging the capacitor; and means for shunting a portion of the current away from the capacitor.

The means for generating a current can include a first current source, the means for discharging the capacitor can include a second current source; and the means for shunting a portion of the current can include a third current source. The means for discharging the capacitor can further include a switch for controlling the second current source.

Another aspect of the present invention is a method for generating an oscillating signal comprising: generating a current; charging a capacitor with the current thereby generating a capacitor voltage signal; comparing the capacitor voltage signal to a bias signal; discharging the capacitor; and shunting a portion of the current away from the capacitor.

Discharging the capacitor can include generating a second current when the difference between the capacitor voltage signal and the bias signal reaches a first value, and then stopping generating the second current when the difference between the capacitor voltage signal and the bias signal reaches a second value.

An advantage of the present invention is that it allows current sources to operate at high currents while charging a capacitor with a small difference current. Thus, an oscillator according to the present invention is less sensitive to noise.

Another advantage of the present invention is that a capacitor used to implement the present invention can remain small and therefore use less die area.

A further advantage of the present invention is that bipolar transistors used to implement an oscillator according to the present invention can operate at high currents thereby improving stability, noise immunity and current gain.

The foregoing and other objects, features and advantages of the invention will become more readily apparent from the following detailed description of a preferred embodiment of the invention which proceeds with reference to the accompanying drawings.

DETAILED DESCRIPTION

This application corresponds to Korean Patent application No. 95-18269, filed Jun. 29, 1995 in the name of Samsung Electronics Co., Ltd., which is hereby incorporated by reference.

Figure 1:
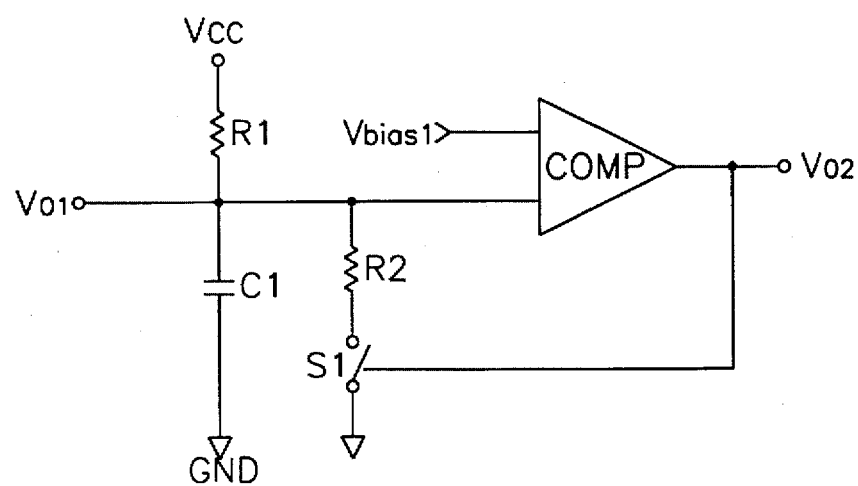
FIG. 1 is a schematic diagram of a prior art analog oscillator circuit.
Figure 2:
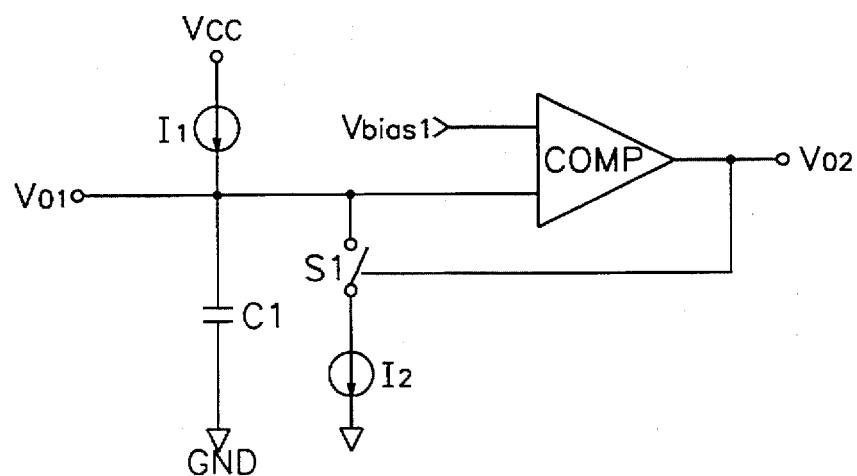
FIG. 2 is a schematic diagram of a prior art analog oscillator circuit which employs current sources.
Figure 3:
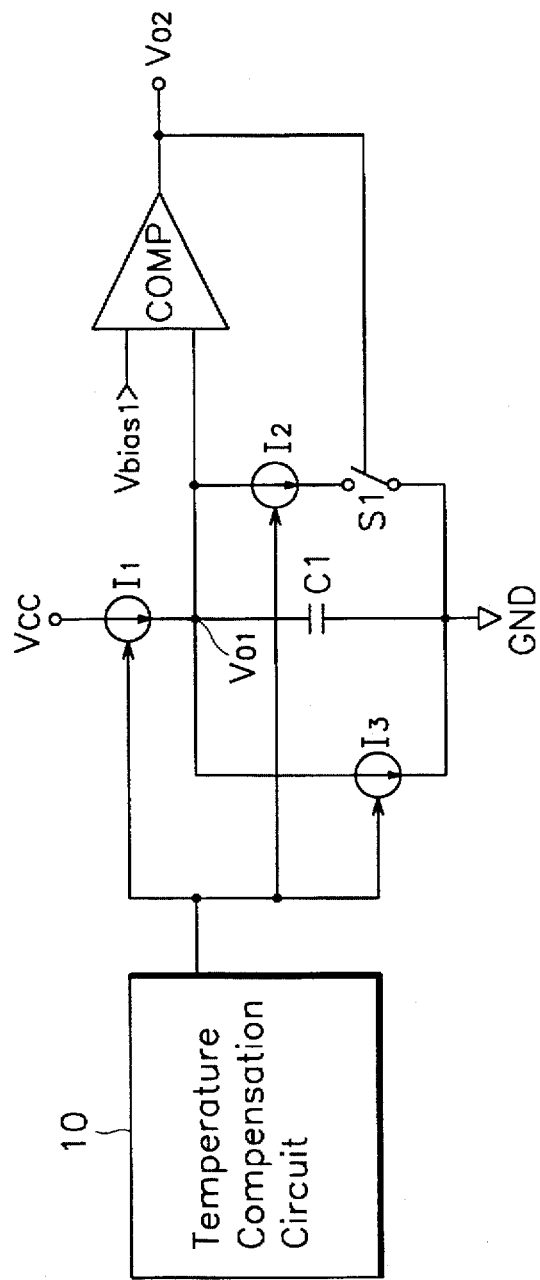
FIG. 3 is a schematic diagram of an embodiment of an analog oscillator circuit in accordance with the present invention.

An embodiment of an analog oscillator circuit according to the present invention is shown in FIG. 3. A description of each of the components will be provided followed by a description of the operation of the circuit.

The embodiment of the invention shown in FIG. 3 is typically implemented on an integrated circuit and includes a capacitor C1 which has one terminal connected to a common supply terminal GND and the other terminal connected to a summing node V01. A first current source I1 for charging the capacitor is connected between the summing node and a voltage supply terminal Vcc. A second current source I2 for discharging the capacitor has one terminal connected to the summing node and the other terminal connected to GND through a single-pole single-throw (SPST) switch S1. A third current source I3 for shunting current away from the capacitor is connected between the summing node and GND. Current sources I1, I2, and I3 are typically implemented with bipolar transistors.

A comparator COMP has a first input terminal connected to the summing node V01, a second input terminal connected to a voltage bias signal Vbias1, and an output terminal connected to switch S1 to control the switch. The output terminal of the comparator also forms the output terminal V02 for the oscillator circuit. The comparator can be a Schmitt trigger circuit having hysteresis.

A temperature compensation circuit 10 can be connected to the current sources I1, I2, and I3 to maintain stable currents with changes in temperature.

Consideration will now be given to the operation of this embodiment of the present invention. The first current source I1 generates a first current i1 which flows into the summing node V01. The third current source I3 generates a third current i3 which shunts a portion of i1 away from capacitor C1. When the voltage at the summing node is less than the voltage level of the voltage bias signal Vbias1, the output terminal of the comparator is at a logic low level and switch S1 is open. Thus, current source I2 does not contribute any current to the summing node, and the capacitor C1 is charged by a charging current which is equal to i1–i3.

As the capacitor charges, the capacitor voltage signal at the summing node continues to rise until it exceeds the voltage of the bias signal, at which time the comparator output switches to a high logic level, thereby closing switch S1. When switch S1 closes, current source I2 generates a second current i2 which is summed with the other currents at the summing node. The third current source I3 continues to shunt a portion of i1 to GND, and the capacitor then discharges at a discharge current which is equal to i1–i2–i3. When the capacitor voltage drops below the bias voltage level, the comparator output switches back to a low logic level, thereby opening switch S1. If the comparator is implemented as a Schmitt trigger, the capacitor voltage drops to a second level that is lower than the bias voltage level before the comparator turns the switch off. When the switch opens, the second current source I2 stops generating current and a new charging cycle begins.

An advantage of the present circuit is that it allows the current sources to operate at high currents while charging the capacitor with the small difference current i1–i3. Thus, the circuit is less sensitive to noise, yet the capacitor can remain small due to the low value of the charging current. The capacitor therefore uses less die area. Further, this circuit also allows the bipolar transistors used to implement the current sources to operate at high currents which improves stability, noise immunity and current gain.

If an oscillation frequency of 50 KHz is selected and Vbias1 is set to 1.5 volts, capacitor C1 in the circuit of FIG. 3 can have a capacitance of 60 pF, the charging current can be about 6.4 microamps (μA) and the discharge current can be about 15 μA. These charge and discharge currents can be realized by a first current source I1 which generates 100 μA, a second current source I2 which generates 21.4 μA and a third current source I3 which generates 93.6 μA. Thus, the current through the current sources is high enough to maintain stability in the bipolar transistors and reduce the circuit's sensitivity to noise while still reducing the size of the capacitor needed to implement the oscillator on an integrated circuit.

To maintain stable operation in the presence of temperature variations, a temperature compensating circuit 10 can be used to maintain constant current in the current sources I1, I2, and I3. The temperature compensating circuit 10 operates by matching the positive temperature coefficient of a resistor with the negative temperature coefficient of the base-emitter voltage of a bipolar transistor.

Figure 4:
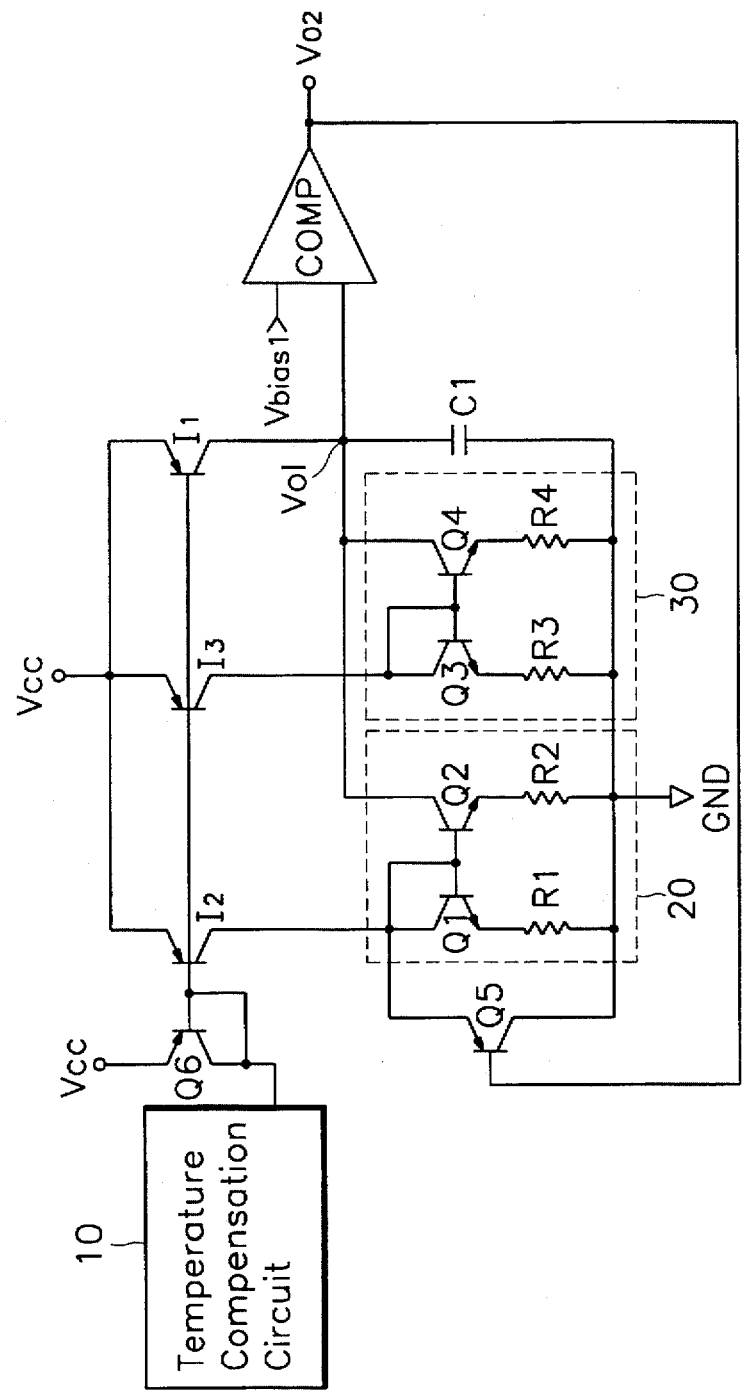
FIG. 4 is a schematic diagram of a preferred embodiment of an analog oscillator circuit in accordance with the present invention.

A prefered embodiment of an analog oscillator circuit according to the present invention is shown in FIG. 4. A description of each of the components will be provided followed by a description of the operation of the circuit.

The embodiment of the invention shown in FIG. 4 is typically implemented on an integrated circuit and includes a capacitor C1 which has one terminal connected to a common supply terminal GND and the other terminal connected to a summing node V01.

An NPN reference transistor Q6 has an emitter connected to a voltage supply terminal Vcc. The collector of Q6 is connected to the output terminal of a temperature compensation circuit 10 which generates a reference current that is independent of temperature. The base of Q6 is connected to the collector of Q6 to form a reference node.

A first PNP current source transistor I1 is connected between Vcc and the summing node and forms a first current source for charging the capacitor. The emitter of transistor I1 is connected to Vcc, the collector of I1 is connected to the summing node, and the base of I1 is connected to the reference node.

A second PNP current source transistor I2 is connected between Vcc and the summing node V01 through a first current mirror circuit 20, thereby forming a second current source for discharging the capacitor. The emitter of transistor I2 is connected to Vcc, and the base of I2 is connected to the reference node. The current mirror circuit includes first and second NPN current mirror transistors Q1 and Q2 configured as a current mirror with the emitters of Q1 and Q2 connected to GND through resistors R1 and R2 respectively. The bases of Q1 and Q2 are connected together, and the base and collector of Q1 are connected together. The collector of Q1 is connected to the collector of I2, and the collector of Q2 is connected to the summing node.

A third PNP current source transistor I3 is connected between Vcc and the summing node V01 through a second current mirror circuit 30, thereby forming a third current source for shunting current from the first current source. The emitter of transistor I3 is connected to Vcc, and the base of I3 is connected to the reference node. The second current mirror circuit includes first and second NPN current mirror transistors Q3 and Q4 configured as a current mirror with the emitters of Q3 and Q4 connected to GND through resistors R3 and R4 respectively. The bases of Q3 and Q4 are connected together, and the base and collector of Q3 are connected together. The collector of Q3 is connected to the collector of I3, and the collector of Q4 is connected to the summing node.

Current source transistors I1, I2 and I3 form current mirrors with Q6, thus transistors I1, I2 and I3 generate currents i1, i2 and i3 respectively which are proportional to the reference current generated by the temperature compensation circuit 10. The second current mirror transistor Q2 generates a second current iq2 which is proportional to i2, and fourth current mirror transistor Q4 generates a third current iq4 which is proportional to i3. By proper selection of emitter areas and resistor values, iq2 can be made equal to i2 and iq4 can be made equal to i3.

A comparator COMP has a first input terminal connected to the summing node V01, a second input terminal connected to a voltage bias signal Vbias1, and an output terminal connected to the base of a PNP switching transistor Q5. The emitter of Q5 is connected to the collector of transistor I2, and the collector of Q5 is connected to GND. The output terminal of the comparator also forms the output terminal V02 for the oscillator circuit. The comparator can be a Schmitt trigger circuit having hysteresis.

Consideration will now be given to the operation of the prefered embodiment of the present invention. The first current source transistor I1 generates a first current i1 which flows into the summing node V01. The third current source transistor I3 generates a third current i3 which flows into the second current mirror circuit 30. The second current mirror circuit 30 generates the current iq4 which flows into the collector of Q4 and shunts a portion of i1 away from capacitor C1. When the voltage at the summing node is less than the voltage level of the voltage bias signal Vbias1, the output terminal of the comparator is at a logic low level which drives transistor Q5 on, thereby diverting current i2 to GND. Thus, current mirror 20 does not contribute any current to the summing node, and the capacitor C1 is charged by a charging current which is equal to i1–q4. If current mirror 30 is balanced, the charging current is i1–i3.

As the capacitor charges, the capacitor voltage signal at the summing node continues to rise until it exceeds the voltage of the bias signal, at which time the comparator output switches to a high logic level, thereby driving Q5 into cutoff. With Q5 in cutoff, the current i2 flows into the first current mirror circuit 20. The first current mirror circuit 20 generates the current iq2 which flows into the collector of Q2 and is summed with the other currents at the summing node. The second current mirror 30 continues to shunt a portion of i1 to GND, and if iq2 is greater than i1–iq4, the capacitor then discharges at a discharge current which is equal to i1–iq2–iq4. If both current mirrors 20 and 30 are balanced, the discharge current is i1–i2–i3.

When the capacitor voltage drops below the bias voltage level, the comparator output switches back to a low logic level, thereby driving switching transistor Q5 on. If the comparator is implemented as a Schmitt trigger, the capacitor voltage drops to a second level that is lower than the bias voltage level before the comparator drives Q5 on. When Q5 is on, the first current source mirror 20 stops generating current and a new charging cycle begins.

To maintain stable operation in the presence of temperature variations, the temperature compensating circuit 10 maintains a constant reference current in Q6. The temperature compensating circuit 10 operates by matching the positive temperature coefficient of a resistor with the negative temperature coefficient of the base-emitter voltage of a bipolar transistor.

An advantage of the present circuit is that it allows the current sources to operate at high currents while charging the capacitor with the small difference current i1–iq4. Thus, the circuit is less sensitive to noise, yet the capacitor can remain small due to the low value of the charging current. The capacitor therefore uses less circuit area. Further, this circuit also allows the bipolar transistors in the current sources to operate at high currents which improves stability, noise immunity and current gain.

Having illustrated and described the principles of the invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. An oscillator circuit comprising:

a capacitor;

a first current source coupled to the capacitor, the first current source generating a first current to charge the capacitor;

a second current source coupled to the capacitor, the second current source generating a second current to discharge the capacitor;

a comparator coupled to the capacitor and the second current source to control the second current source responsive to the capacitor voltage; and a third current source coupled to the capacitor to shunt a portion of the first current away from the capacitor.

2. An oscillator circuit according to claim 1 further including a switch coupled to the second current source to control the second current source.

3. An oscillator circuit according to claim 1 further including a temperature compensation circuit coupled to the current sources.

4. An oscillator circuit according to claim 1 wherein the second current source includes a current mirror circuit.

5. An oscillator circuit according to claim 1 wherein the third current source includes a current mirror circuit.

6. An oscillator circuit according to claim 1 further including:

a first supply terminal;

a second supply terminal;

a reference node; and a summing node;

the capacitor including a first terminal coupled to the first supply terminal and a second terminal coupled to the summing node.

7. An oscillator circuit according to claim 6 wherein:

the first current source includes a first current source transistor having an emitter coupled to the second supply terminal, a base coupled to the reference node, and a collector coupled to the summing node;

the second current source includes a second current source transistor having an emitter coupled to the second supply terminal, a base coupled to the reference node, and a collector coupled to the summing node; and the third current source includes a third current source transistor having an emitter coupled to the second supply terminal, a base coupled to the reference node, and a collector coupled to the summing node.

8. An oscillator circuit according to claim 7 wherein the comparator includes a first input terminal coupled to the summing node, a second input terminal coupled to a bias signal and an output terminal coupled to the second current source.

9. An oscillator circuit according to claim 8 further including a switching transistor having a collector coupled to the first supply terminal, an emitter coupled to the collector of the second current source transistor, and a base coupled to the output terminal of the comparator.

10. An oscillator circuit according to claim 6 further including:
   a temperature compensation circuit having an output terminal; and
   a reference transistor having an emitter coupled to the second supply terminal, a collector coupled to the output terminal of the temperature compensation circuit and the reference node, and a base coupled to the reference node.

11. An oscillator circuit according to claim 7 wherein the second current source further includes:
   a first current mirror transistor having an emitter, a base and a collector;
   a second current mirror transistor having an emitter, a base and a collector;
   a first resistor; and
   a second resistor;
   the collector of the first current mirror transistor coupled to the collector of the second current source transistor, the emitter of the first current mirror transistor coupled to the first supply terminal through the first resistor, the collector and base of the first current mirror transistor coupled together;
   the collector of the second current mirror transistor coupled to the summing node, the emitter of the second current mirror transistor coupled to the first supply terminal through the second resistor, the base the second current mirror transistor coupled to the base of the first current mirror transistor.

12. An oscillator circuit according to claim 7 wherein the third current source further includes:
   a third current mirror transistor having an emitter, a base and a collector;
   a fourth current mirror transistor having an emitter, a base and a collector;
   a third resistor; and
   a fourth resistor;
   the collector of the third current mirror transistor coupled to the collector of the third current source transistor, the emitter of the third current mirror transistor coupled to the first supply terminal through the third resistor, the collector and base of the third current mirror transistor coupled together;
   the collector of the fourth current mirror transistor coupled to the summing node, the emitter of the fourth current mirror transistor coupled to the first supply terminal through the fourth resistor, the base of the fourth current mirror transistor coupled to the base of the third current mirror transistor.

13. An oscillator circuit comprising;
   a capacitor;
   means for generating a current to charge the capacitor, thereby generating a capacitor voltage signal;
   means for comparing the capacitor voltage signal to a bias signal;
   means for discharging the capacitor; and
   means for shunting a portion of the current away from the capacitor;
   wherein the means for generating a current includes a first current source, the means for discharging the capacitor includes a second current source; and the means for shunting a portion of the current includes a third current source.

14. An oscillator circuit according to claim 13 wherein the means for discharging the capacitor further includes a switch for controlling the second current source.

15. An oscillator circuit according to claim 13 further including means for temperature compensating the current sources.

16. A method for generating an oscillating signal comprising:
   generating a first current;
   shunting a portion of the first current, thereby generating a charge current;
   charging a capacitor with the charge current thereby generating a capacitor voltage signal;
   comparing the capacitor voltage signal to a bias signal; and
   discharging the capacitor;
   wherein shunting a portion of the current includes generating a third current.

17. A method according to claim 16 wherein discharging the capacitor includes generating a second current when the difference between the capacitor voltage signal and the bias signal reaches a first value.

18. A method according to claim 17 wherein discharging the capacitor further includes stopping generating the second current when the difference between the capacitor voltage signal and the bias signal reaches a second value.

* * * * *